(12) United States Patent
He et al.

(10) Patent No.: US 11,335,832 B2
(45) Date of Patent: May 17, 2022

(54) LED PACKAGE STRUCTURE AND CARRIER THEREOF

(71) Applicant: KAISTAR Lighting(Xiamen) Co., Ltd., Xiamen (CN)

(72) Inventors: Tian He, Xiamen (CN); Wei-Hong Yang, Xiamen (CN); Jing Chen, Xiamen (CN)

(73) Assignee: KAISTAR LIGHTING(XIAMEN) CO., LTD., Xiamen (CN)

(*) Notice: Subject to any disclaimer, the term of this patent is extended or adjusted under 35 U.S.C. 154(b) by 36 days.

(21) Appl. No.: 16/919,202

(22) Filed: Jul. 2, 2020

(65) Prior Publication Data

US 2020/0335668 A1 Oct. 22, 2020

(30) Foreign Application Priority Data

Oct. 31, 2019 (CN) .......................... 201911052542.2

(51) Int. Cl.
| | |
|---|---|
| H01L 33/48 | (2010.01) |
| H01L 25/075 | (2006.01) |
| H01L 33/10 | (2010.01) |
| H01L 33/54 | (2010.01) |
| H01L 33/62 | (2010.01) |

(52) U.S. Cl.
CPC ........ *H01L 33/486* (2013.01); *H01L 25/0753* (2013.01); *H01L 33/10* (2013.01); *H01L 33/54* (2013.01); *H01L 33/62* (2013.01)

(58) Field of Classification Search
CPC ....... H01L 33/486; H01L 33/10; H01L 33/54; H01L 33/62; H01L 25/0753
See application file for complete search history.

(56) References Cited

U.S. PATENT DOCUMENTS 10,355,179 B2 7/2019 Chiu
2017/0345979 A1* 11/2017 Chiu ...................... H01L 33/52

FOREIGN PATENT DOCUMENTS

CN 103887402 A 6/2014

* cited by examiner

*Primary Examiner* — Sue A Purvis
*Assistant Examiner* — Scott Stowe
(74) *Attorney, Agent, or Firm* — Li & Cai Intellectual Property (USA) Office

(57) ABSTRACT

An LED package structure and a carrier thereof are provided. The LED package structure includes a carrier, a plurality of LED chips, and an encapsulating colloid. The carrier includes a substrate, a ring-shaped first wall disposed on the substrate, and a ring-shaped second wall stacked on the first wall. A portion of the substrate surrounded by the first wall is defined as a die-bonding region, and the first wall, the second wall, and the die-bonding region jointly define an accommodating space. The LED chips are mounted on the die-bonding region and are arranged in the accommodating space. The encapsulating colloid is filled within the accommodating space, and the LED chips are embedded in the encapsulating colloid.

20 Claims, 6 Drawing Sheets

LED PACKAGE STRUCTURE AND CARRIER THEREOF

CROSS-REFERENCE TO RELATED PATENT APPLICATION

This application claims the benefit of priority to China Patent Application No. 201911052542.2, filed on Oct. 31, 2019 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting member, and more particularly to a light emitting diode (LED) package structure and a carrier thereof.

BACKGROUND OF THE DISCLOSURE

A conventional LED package structure is provided by forming a single-layer dam onto a substrate, and an inner space of the dam is provided for accommodating LED chips. Since it has become quite common for the conventional LED package structure to be configured with the single-layer dam, the design and the performance of the conventional LED package structure are inadvertently limited by the single-layer dam. For example, as any such LED package structure needs to be formed with a specific height, the single-layer dam would be formed with a large width due to the single layer construction thereof.

SUMMARY OF THE DISCLOSURE

In response to the above-referenced technical inadequacies, the present disclosure provides an LED package structure and a carrier thereof to effectively improve on the issues associated with conventional LED package structures.

In one aspect, the present disclosure provides a light emitting diode (LED) package structure, which includes a carrier, a plurality of LED chips, and an encapsulating colloid. The carrier includes a substrate and a multi-layer surrounding dam. The substrate has a first board surface and a second board surface that is opposite to the first board surface. The multi-layer surrounding dam is formed on the first board surface of the substrate, and includes a first wall and a second wall. The first wall is in a ring-shape and is disposed on the first board surface, and a portion of the first board surface surrounded by the first wall is defined as a die-bonding region. The second wall is in a ring-shape and is stacked on the first wall. The first wall, the second wall, and the die-bonding region jointly define an accommodating space. The LED chips are mounted on the die-bonding region of the substrate and are arranged in the accommodating space. The encapsulating colloid is filled within the accommodating space, and the LED chips are embedded in the encapsulating colloid.

In certain embodiments, an outer lateral side of the multi-layer surrounding dam has a maximum outer diameter, and an inner lateral side of the multi-layer surrounding dam has a minimum inner diameter that is at least 80% of the maximum outer diameter.

In certain embodiments, an outer lateral side and an inner lateral side of the multi-layer surrounding dam have a maximum width there-between that is less than or equal to a height of the multi-layer surrounding dam with respect to the first board surface.

In certain embodiments, the maximum width of the multi-layer surrounding dam is within in a range of 70% to 80% of the height of the multi-layer surrounding dam.

In certain embodiments, each of the first wall and the second wall is arranged head-tail so as to form a ring-shaped structure, and a head-tail junction of the second wall is not located at the same location as a head-tail junction of the first wall.

In certain embodiments, a bottom side of the second wall is in a concave shape and is gaplessly connected to a top side of the first wall, and wherein in a cross section of the multi-layer surrounding dam perpendicular to the substrate, the bottom side and a top side of the second wall are each in an arc shape, and a radius of curvature of the top side of the second wall is less than a radius of curvature of the bottom side of the second wall.

In certain embodiments, each of the LED chips is in an elongated shape defining a longitudinal direction, and the LED chips are divided into a first chip group and a second chip group, and wherein the longitudinal direction of any one of the LED chips in the first chip group is parallel to a first direction, and the longitudinal direction of any one of the LED chips in the second chip group is parallel to a second direction that is not parallel to the first direction. In certain embodiments, the second chip group is arranged to surround an outer side of the first chip group, and wherein in the second chip group, a minimum distance between the multi-layer surrounding dam and any one of the LED chips is 90% to 110% of a minimum distance between the multi-layer surrounding dam and another one of the LED chips.

In certain embodiments, the first direction is perpendicular to the second direction.

In certain embodiments, an inner lateral side of the multi-layer surrounding dam has a ring-shaped groove recessed in a connection portion between the first wall and the second wall, a height of the ring-shaped groove with respect to the first board surface is greater than a thickness of any one of the LED chips, and the ring-shaped groove is fully filled with the encapsulating colloid.

In certain embodiments, the encapsulating colloid has a plurality of phosphor embedded therein, and wherein in a cross section of the multi-layer surrounding dam perpendicular to the substrate, a top side of the second wall is in an arc shape and has a radius of curvature that is less than or equal to 50% of a maximum width of the second wall.

In certain embodiments, the second wall does not contact the first board surface of the substrate, and the die-bonding region of the first board surface is a light reflective surface.

In another aspect, the present disclosure provides a carrier of a light emitting diode (LED) package structure, which includes a substrate and a multi-layer surrounding dam. The substrate has a first board surface and a second board surface that is opposite to the first board surface. The multi-layer surrounding dam is formed on the first board surface of the substrate, and includes a first wall and a second wall. The first wall is in a ring-shape and is disposed on the first board surface, and a portion of the first board surface surrounded by the first wall is defined as a die-bonding region. The second wall is in a ring-shape and is stacked on the first wall. The first wall, the second wall, and the die-bonding region jointly define an accommodating space.

In certain embodiments, an outer lateral side of the multi-layer surrounding dam has a maximum outer diameter, and an inner lateral side of the multi-layer surrounding dam has a minimum inner diameter that is at least 80% of the maximum outer diameter.

In certain embodiments, an outer lateral side and an inner lateral side of the multi-layer surrounding dam have a maximum width there-between that is less than or equal to a height of the multi-layer surrounding dam with respect to the first board surface.

In certain embodiments, the maximum width of the multi-layer surrounding dam is within in a range of 70% to 80% of the height of the multi-layer surrounding dam.

In certain embodiments, each of the first wall and the second wall is arranged head-tail so as to form a ring-shaped structure, and a head-tail junction of the second wall is not located at the same location as a head-tail junction of the first wall.

In certain embodiments, an inner lateral side of the multi-layer surrounding dam has a ring-shaped groove recessed in a connection portion between the first wall and the second wall.

In certain embodiments, the encapsulating colloid has a plurality of phosphor embedded therein, and wherein in a cross section of the multi-layer surrounding dam perpendicular to the substrate, a top side of the second wall is in an arc shape and has a radius of curvature that is less than or equal to 50% of a maximum width of the second wall.

In certain embodiments, a bottom side of the second wall is in a concave shape and is gaplessly connected to a top side of the first wall, the second wall does not contact the first board surface of the substrate, and the die-bonding region of the first board surface is a light reflective surface.

Therefore, the LED package structure (or the carrier) in the present disclosure differs from the conventional LED package structure in that the multi-layer surrounding dam is formed in a configuration where the second wall is stacked upon the first wall, thereby further increasing the performance of the LED package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
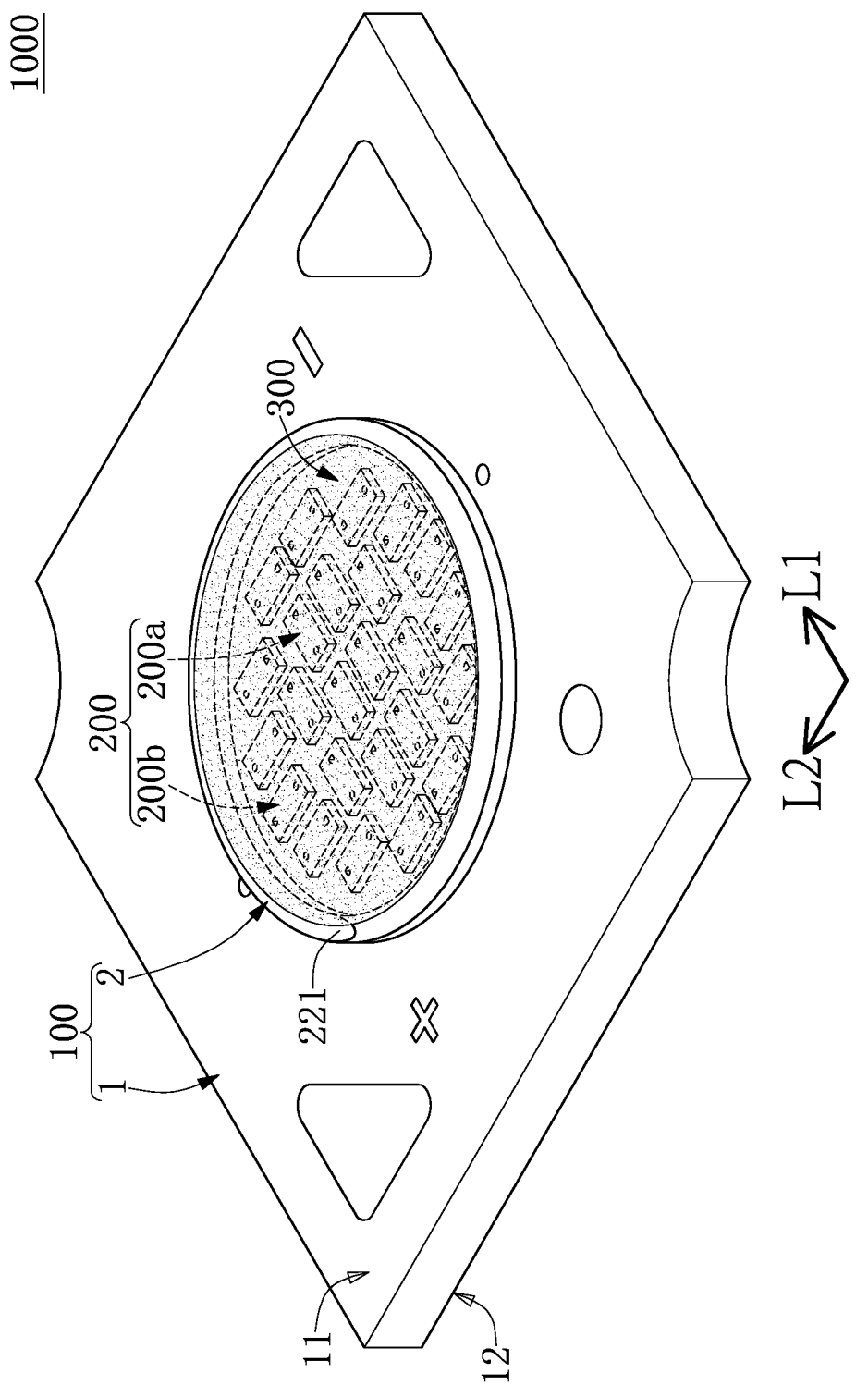
FIG. 1 is a perspective view of an LED package structure according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 6, an embodiment of the present disclosure provides a light emitting diode (LED) package structure 1000. As shown in FIG. 1, the LED package structure 1000 in the present embodiment is preferably formed in a chip-on-board (COB) configuration. In other words, the LED package structure 1000 of the present embodiment excludes any package structure that is not formed in the COB configuration. The LED package structure 1000 includes a carrier 100, a plurality of LED chips 200 mounted on the carrier 100, and an encapsulating colloid 300 that is formed on the carrier 100 that has the LED chips 200 embedded therein.

It should be noted that the carrier 100 in the present embodiment is described in cooperation with the LED chips 200 and the encapsulating colloid 300, but the present disclosure is not limited thereto. For example, in other embodiments of the present disclosure, the carrier 100 can be independently used (e.g., sold) or can be used in cooperation with other components (e.g., a driving component used for driving the LED chips 200 can be disposed on the carrier 100).

Figure 2:
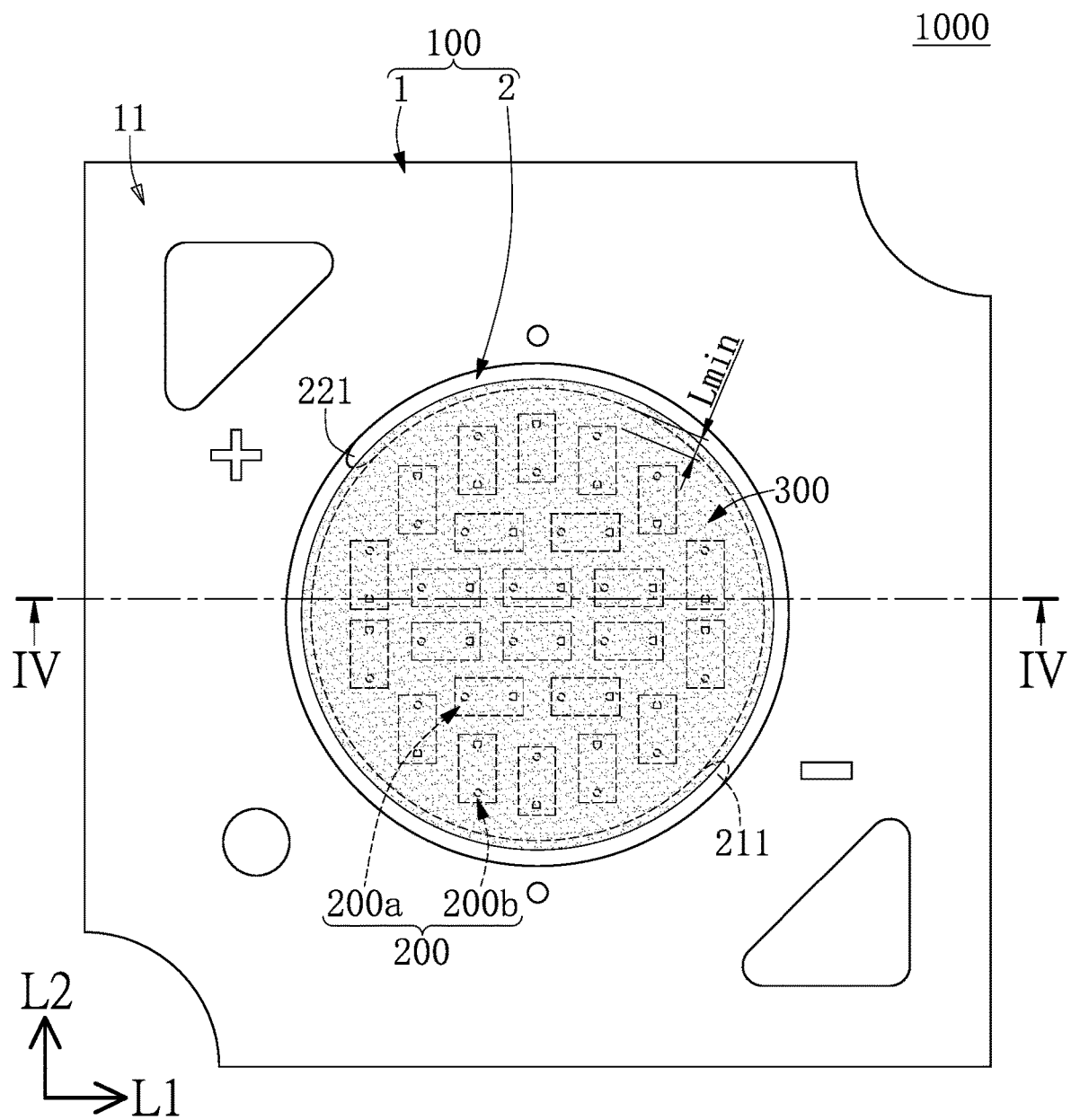
FIG. 2 is a top view of FIG. 1.
Figure 3:
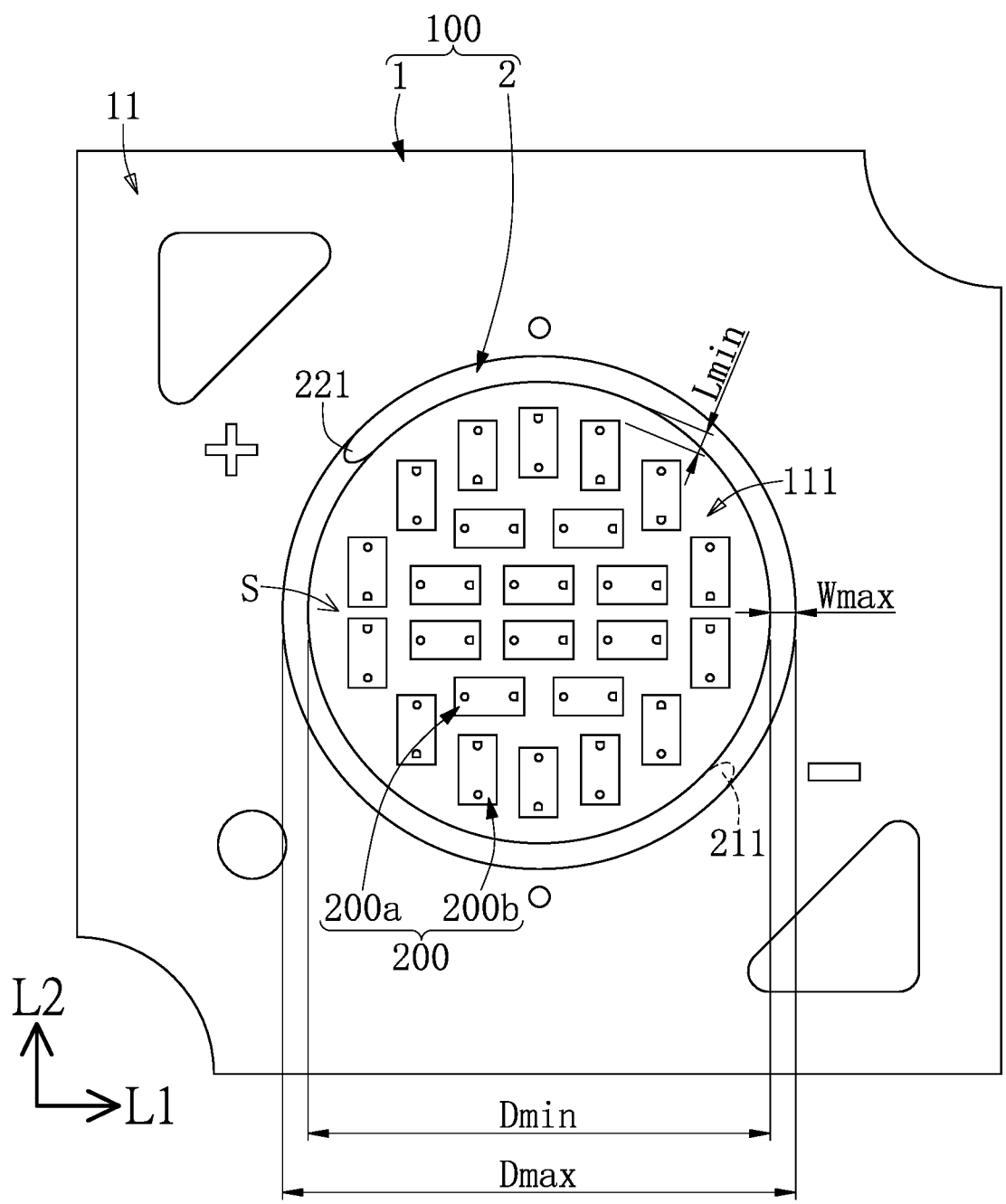
FIG. 3 is a top view of FIG. 1 when an encapsulating colloid is omitted.
Figure 4:
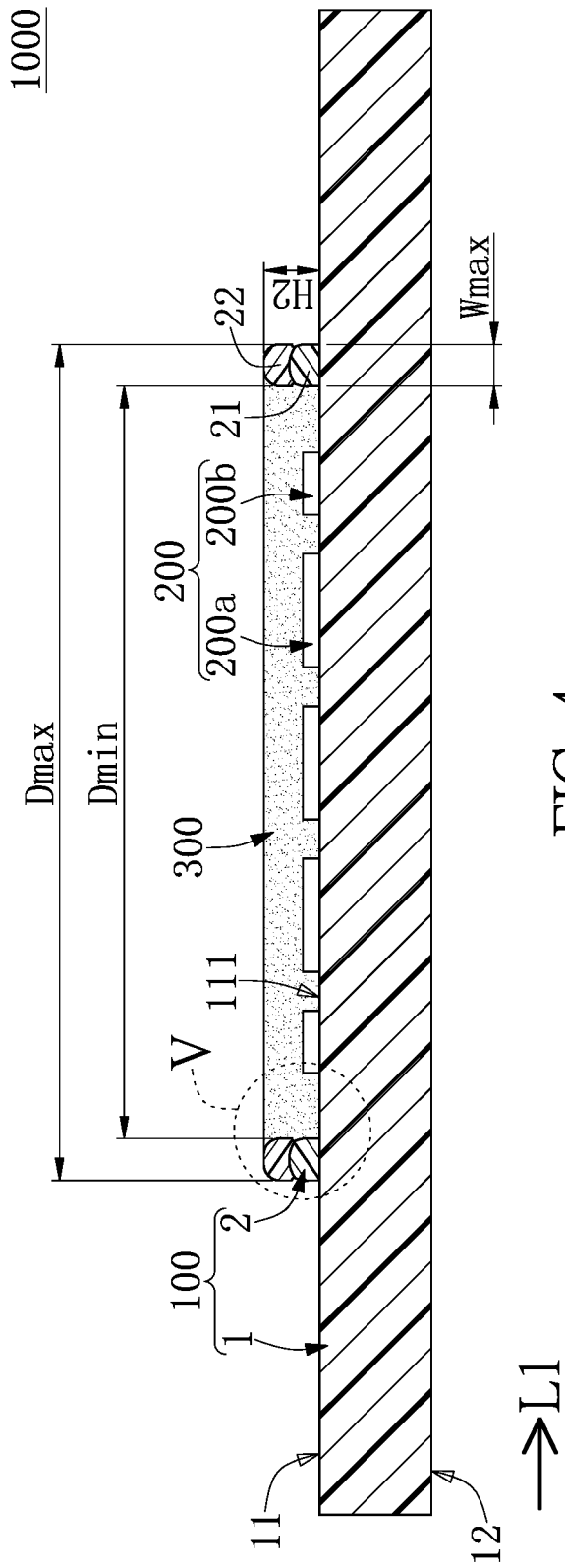
FIG. 4 is a cross-sectional view taken along line IV-IV of FIG. 2.

As shown in FIG. 2 to FIG. 4, the carrier 100 includes a substrate 1 and a multi-layer surrounding dam 2 that is formed on the substrate 1. The substrate 1 has a first board surface 11 and a second board surface 12 that is opposite to the first board surface 11, and the multi-layer surrounding dam 2 is formed on the first board surface 11. In the present embodiment, the first board surface 11 of the substrate 1 is substantially parallel to the second board surface 12, and the substrate 1 is in a square shape and is a ceramic board having a circuit unit (e.g., transmitting circuits, electrodes, or conductive posts), but the present disclosure is not limited thereto. For example, in other embodiments of the present disclosure, the substrate 1 can be in a circular shape or other shapes, and the substrate 1 can be a printed circuit board (PCB).

The multi-layer surrounding dam 2 in the present embodiment is in a circular ring-shape, a portion of the first board surface 11 surrounded by the multi-layer surrounding dam 2 is defined as a die-bonding region 111 that is preferably a light reflective surface, but the present disclosure is not limited thereto. For example, in other embodiments of the present disclosure, the multi-layer surrounding dam 2 can be in other ring-shapes (e.g., a square ring-shape). Or, the die-bonding region 111 of the first board surface 11 can be a non-reflective surface.

In the present embodiment, an outer lateral side of the multi-layer surrounding dam 2 has a maximum outer diameter $D_{max}$, and an inner lateral side of the multi-layer surrounding dam 2 has a minimum inner diameter $D_{min}$ that is preferably at least 80% (e.g., 86% to 91%) of the maximum outer diameter $D_{max}$. Accordingly, the die-bonding region 111 of the substrate 1 can be effectively expanded by controlling a ratio between the minimum inner diameter $D_{min}$ and the maximum outer diameter $D_{max}$ of the multi-layer surrounding dam 2, thereby increasing a light emitting area of the LED package structure 1000.

Moreover, the outer lateral side and the inner lateral side of the multi-layer surrounding dam 2 have a maximum width $W_{max}$ there-between that is less than or equal to a height H2 of the multi-layer surrounding dam 2 with respect to the first board surface 11. In the present embodiment, the maximum width $W_{max}$ of the multi-layer surrounding dam 2 is preferably within a range of 70% to 80% of the height H2 of the multi-layer surrounding dam 2, but the present disclosure is not limited thereto. Accordingly, the multi-layer surrounding dam 2 can be formed to be a thinner structure by controlling a ratio between the maximum width $W_{max}$ and the height H2 of the multi-layer surrounding dam 2, thereby effectively reducing the volume of the multi-layer surrounding dam 2 so as to decrease the material cost.

Specifically, the multi-layer surrounding dam 2 can be formed by a plurality of ring-shaped walls stacked with each other, and the multi-layer surrounding dam 2 is preferably provided with a light reflective function. The multi-layer surrounding dam 2 in the present embodiment includes a ring-shaped first wall 21 and a ring-shaped second wall 22 that is stacked on the first wall 21, but the present disclosure is not limited thereto. For example, in other embodiments of the present disclosure, the multi-layer surrounding dam 2 can further include a third wall stacked on the second wall 22. Or, the multi-layer surrounding dam 2 can be provided without any light reflective function.

Accordingly, the LED package structure 1000 of the present embodiment differs from the conventional LED package structure in that the multi-layer surrounding dam 2 is formed in a configuration where the second wall 22 is stacked upon the first wall 21, thereby further increasing the performance of the LED package structure 1000.

Since the size of the first wall 21 is similar to that of the second wall 22, the maximum outer diameter $D_{max}$, the minimum inner diameter $D_{min}$, and the maximum width $W_{max}$ of the multi-layer surrounding dam 2 can be defined by the first wall 21 or the second wall 22, but the present disclosure is not limited thereto. For example, in other embodiments of the present disclosure, the size of the first wall 21 can be different from that of the second wall 22, so that the maximum outer diameter $D_{max}$, the minimum inner diameter $D_{min}$, and the maximum width $W_{max}$ are defined by the first wall 21 and the second wall 22.

Moreover, the first wall 21 and the second wall 22 in the present embodiment are made of the same material, but in other embodiments of the present disclosure, the first wall 21 and the second wall 22 can be made of different materials.

In the present embodiment, the first wall 21 is in a circular ring-shape, and a portion of the first board surface 11 surrounded by the first wall 21 is defined as the die-bonding region 111. The second wall 22 is also in a circular ring-shape, and the first wall 21, the second wall 22, and the die-bonding region 111 jointly define an accommodating space S. The LED chips 200 are mounted on the die-bonding region 111 and are arranged in the accommodating space S. The encapsulating colloid 300 includes a plurality of phosphor embedded therein, and is (fully) filled within the accommodating space S, and the LED chips 200 are embedded in the encapsulating colloid 300.

Specifically, each of the first wall 21 and the second wall 22 is arranged head-tail so as to form a ring-shaped structure, and a head-tail junction 221 of the second wall 22 is not located at the same location as a head-tail junction 211 of the first wall 21. In other words, the head-tail junction 221 of the second wall 22 is stacked on a portion of the first wall 21 other than the head-tail junction 211. The head-tail junctions 211, 221 of the multi-layer surrounding dam 2 are slightly uneven and are respectively arranged at different positions, so that a height difference caused by the two head-tail junctions 211, 221 can be reduced. Accordingly, an outer surface of the encapsulating colloid 300 connected to the multi-layer surrounding dam 2 can be more even and smooth. However, in other embodiments of the present disclosure, the head-tail junctions 211, 221 of the first wall 21 and the second wall 22 can be arranged at the same position (e.g., can be stacked with each other).

Figure 5:
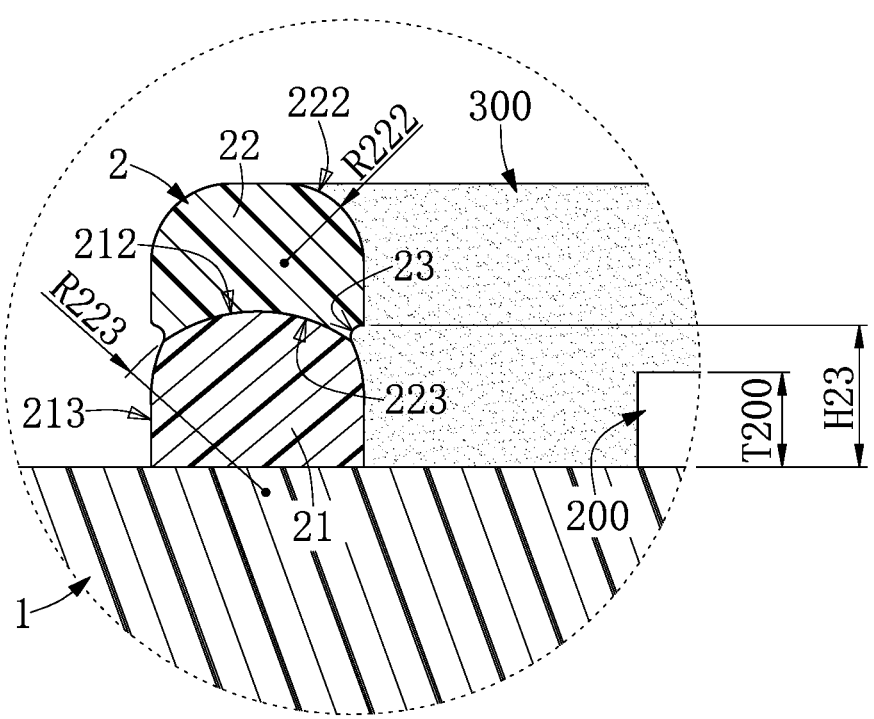
FIG. 5 is an enlarged view of portion V of FIG. 4.

As shown in FIG. 4 and FIG. 5, a bottom side 223 of the second wall 22 is in a concave shape and is gaplessly connected to a top side 212 of the first wall 21. The second wall 22 in the present embodiment is preferably not in contact with the first board surface 11 of the substrate 1, and the second wall 22 is also not in contact with a lateral side 213 of the first wall 21, but the present disclosure is not limited thereto. For example, in other embodiments of the present disclosure, the second wall 22 can be in contact with a portion of the first board surface 11 other than the die-bonding region 111.

Specifically, in a cross section (shown in FIG. 5) of the multi-layer surrounding dam 2 perpendicular to the substrate 1, the bottom side 223 and a top side 222 of the second wall 22 are each in an arc shape, and a radius of curvature R222 of the top side 222 of the second wall 22 is less than a radius of curvature R223 of the bottom side 223 of the second wall 22. Moreover, the radius of curvature 8222 of the top side 222 of the second wall 22 is less than or equal to 50% of a maximum width $W_{max}$ of the second wall 22, and the radius of curvature 8222 is preferably less than or equal to 0.25 mm. Accordingly, the phosphor adjacent to the top side 222 of the second wall 22 are more easily excited, so that light emitted from the LED package structure 1000 can have a uniform color.

In other words, the inner lateral side of the multi-layer surrounding dam 2 has a ring-shaped groove 23 recessed in a connection portion between the first wall 21 and the second wall 22. Moreover, a height H23 of the ring-shaped groove 23 with respect to the first board surface 11 is greater than a thickness T200 of any one of the LED chips 200, and the ring-shaped groove 23 is fully filled with the encapsulating colloid 300. Accordingly, the multi-layer surrounding dam 2 is formed with the ring-shaped groove 23 that is connected to the encapsulating colloid 300, so that the connection strength between the encapsulating colloid 300 and the multi-layer surrounding dam 2 can be effectively increased, and the junction line between the encapsulating colloid 300 and the multi-layer surrounding dam 2 can be extended to prevent moisture from seeping into the LED package structure 1000 along the connection path between the encapsulating colloid 300 and the multi-layer surrounding dam 2.

As shown in FIG. 2 to FIG. 4, each of the LED chips 200 is in an elongated shape defining a longitudinal direction. The LED chips 200 are divided into or defined as a first chip group 200a and a second chip group 200b. The longitudinal direction of any one of the LED chips 200 in the first chip group 200a is parallel to a first direction L1, and the longitudinal direction of any one of the LED chips 200 in the second chip group 200b is parallel to a second direction L2 that is not parallel to the first direction L1. In the present embodiment, the first direction L1 is preferably perpendicular to the second direction L2, but the present disclosure is not limited thereto.

Moreover, the second chip group 200b is arranged to surround an outer side of the first chip group 200a. In the second chip group 200b, a minimum distance $L_{min}$ between the multi-layer surrounding dam 2 and any one of the LED chips 200 is 90% to 110% of a minimum distance $L_{min}$ between the multi-layer surrounding dam 2 and another one of the LED chips 200. In other words, the LED chips 200 of the LED package structure 1000 can be uniformly distributed on the die-bonding region 111 by the arrangement of the first chip group 200a and the second chip group 200b, thereby effectively increasing lighting performance of the LED package structure 1000.

Figure 6:
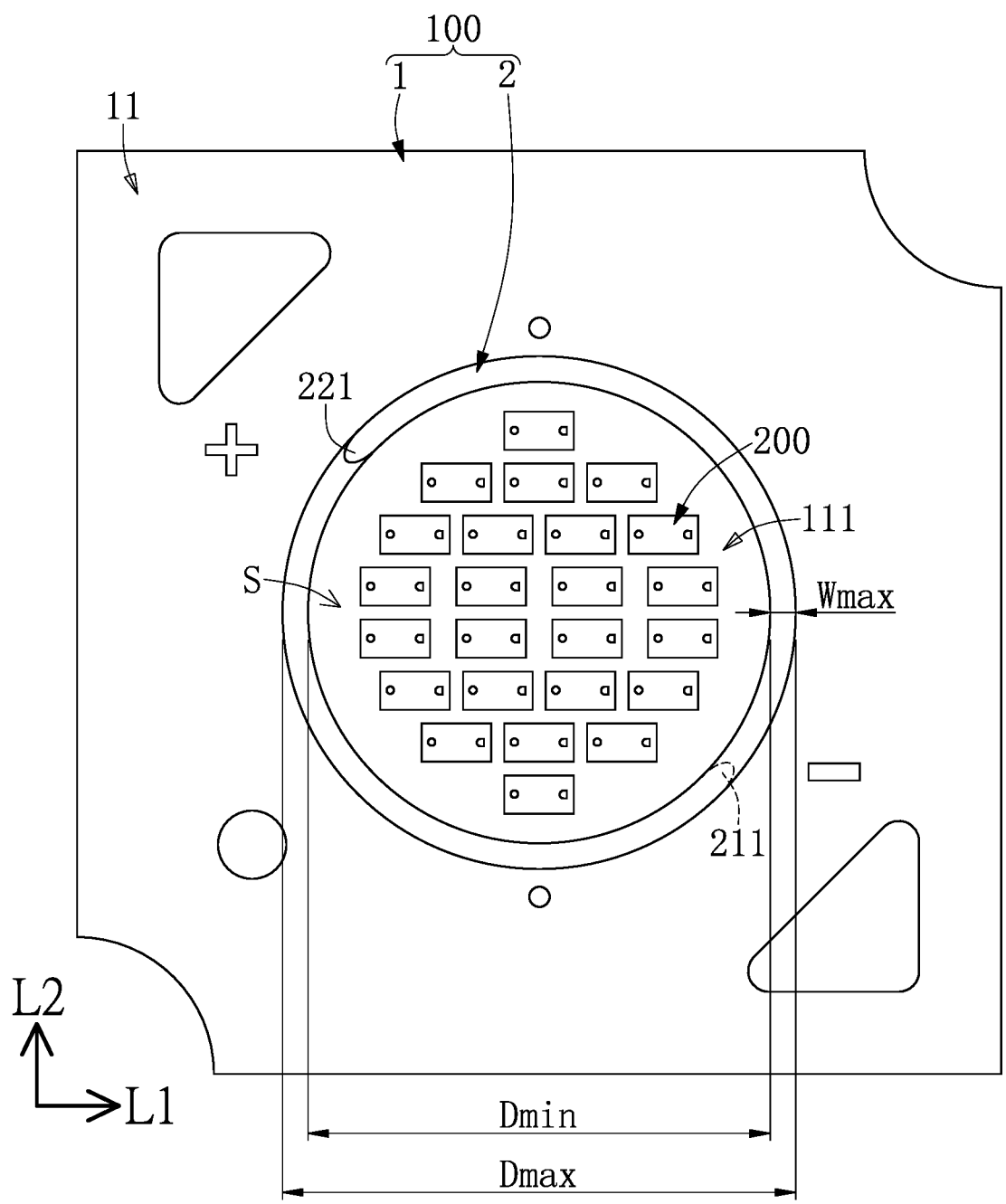
FIG. 6 is a top view of the LED package structure in another configuration according to the present disclosure when the encapsulating colloid is omitted.

However, while the arrangement of the LED chips 200 in the present embodiment is provided as shown in FIG. 3, the present disclosure is not limited thereto. For example, as shown in FIG. 6, the longitudinal directions of the LED chips 200 can be parallel to the same direction (e.g., the first direction L1) according to design requirements.

In conclusion, the LED package structure (or the carrier) in the present disclosure differs from the conventional LED package structure in that the multi-layer surrounding dam is formed in a configuration where the second wall is stacked upon the first wall, thereby further increasing the performance of the LED package structure. Moreover, the LED package structure (or the carrier) of the present disclosure can be provided with the following effects.

1. The die-bonding region of the substrate can be effectively expanded by controlling a ratio between the minimum inner diameter and the maximum outer diameter of the multi-layer surrounding dam, thereby increasing a light emitting area of the LED package structure.

2. The multi-layer surrounding dam can be formed to be a thinner structure by controlling a ratio between the maximum width and the height of the multi-layer surrounding dam, thereby effectively reducing the volume of the multi-layer surrounding dam so as to decrease the material cost.

3. The head-tail junctions of the multi-layer surrounding dam are slightly uneven and are respectively arranged at different positions, so that a height difference caused by the two head-tail junctions can be reduced. Accordingly, an outer surface of the encapsulating colloid connected to the multi-layer surrounding dam can be more even and smooth.

4. The radius of curvature of the top side of the second wall can be controlled to be less than or equal to 50% of a maximum width of the second wall, so that the phosphor adjacent to the top side of the second wall are more easily excited, and light emitted from the LED package structure can have a uniform color.

5. The multi-layer surrounding dam is formed with the ring-shaped groove that is connected to the encapsulating colloid, so that the connection strength between the encapsulating colloid and the multi-layer surrounding dam can be effectively increased, and the connection path between the encapsulating colloid and the multi-layer surrounding dam can be extended to prevent moisture from seeping into the LED package structure along the connection path between the encapsulating colloid and the multi-layer surrounding dam.

6. The LED chips of the LED package structure can be uniformly distributed on the die-bonding region by the arrangement of the first chip group and the second chip group, thereby effectively increasing lighting performance of the LED package structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting diode (LED) package structure, comprising:
 a carrier including:
  a substrate having a first board surface and a second board surface that is opposite to the first board surface; and
  a multi-layer surrounding dam formed on the first board surface of the substrate and including:
   a first wall being in a ring-shape and disposed on the first board surface, wherein a portion of the first board surface surrounded by the first wall is defined as a die-bonding region; and
   a second wall being in a ring-shape and stacked on the first wall, wherein the first wall, the second wall, and the die-bonding region jointly define an accommodating space;
 a plurality of LED chips mounted on the die-bonding region of the substrate and arranged in the accommodating space; and
 an encapsulating colloid filled within the accommodating space, wherein the LED chips are embedded in the encapsulating colloid;
 wherein each of the LED chips is in an elongated shape defining a longitudinal direction, and the LED chips are divided into a first chip group and a second chip group, and wherein the longitudinal direction of any one of the LED chips in the first chip group is parallel to a first direction, and the longitudinal direction of any one of the LED chips in the second chip group is parallel to a second direction that is not parallel to the first direction.

2. The LED package structure according to claim 1, wherein an outer lateral side of the multi-layer surrounding dam has a maximum outer diameter, and an inner lateral side of the multi-layer surrounding dam has a minimum inner diameter that is at least 80% of the maximum outer diameter.

3. The LED package structure according to claim 1, wherein an outer lateral side and an inner lateral side of the multi-layer surrounding dam have a maximum width there-between that is less than or equal to a height of the multi-layer surrounding dam with respect to the first board surface.

4. The LED package structure according to claim 3, wherein the maximum width of the multi-layer surrounding dam is within in a range of 70% to 80% of the height of the multi-layer surrounding dam.

5. The LED package structure according to claim 1, wherein each of the first wall and the second wall is arranged head-tail so as to form a ring-shaped structure, and a head-tail junction of the second wall is not located at the same location as a head-tail junction of the first wall.

6. The LED package structure according to claim 1, wherein a bottom side of the second wall is in a concave shape and is gaplessly connected to a top side of the first wall, and wherein in a cross section of the multi-layer surrounding dam perpendicular to the substrate, the bottom side and a top side of the second wall are each in an arc shape, and a radius of curvature of the top side of the second wall is less than a radius of curvature of the bottom side of the second wall.

7. The LED package structure according to claim 1 wherein the second chip group is arranged to surround an outer side of the first chip group, and wherein in the second chip group, a minimum distance between the multi-layer surrounding dam and any one of the LED chips is 90% to 110% of a minimum distance between the multi-layer surrounding dam and another one of the LED chips.

8. The LED package structure according to claim 1, wherein the first direction is perpendicular to the second direction.

9. The LED package structure according to claim 1, wherein an inner lateral side of the multi-layer surrounding dam has a ring-shaped groove recessed in a connection portion between the first wall and the second wall, a height of the ring-shaped groove with respect to the first board surface is greater than a thickness of any one of the LED chips, and the ring-shaped groove is fully filled with the encapsulating colloid.

10. The LED package structure according to claim 1, wherein the encapsulating colloid has a plurality of phosphor embedded therein, and wherein in a cross section of the multi-layer surrounding dam perpendicular to the substrate, a top side of the second wall is in an arc shape and has a radius of curvature that is less than or equal to 50% of a maximum width of the second wall.

11. The LED package structure according to claim 1, wherein the second wall does not contact the first board surface of the substrate, and the die-bonding region of the first board surface is a light reflective surface.

12. A carrier of a light emitting diode (LED) package structure, comprising:
a substrate having a first board surface and a second board surface that is opposite to the first board surface; and
a multi-layer surrounding dam formed on the first board surface of the substrate and including:
a first wall being in a ring-shape and disposed on the first board surface, wherein a portion of the first board surface surrounded by the first wall is defined as a die-bonding region for providing at least one LED chip to be mounted thereon; and
a second wall being in a ring-shape and stacked on the first wall, wherein the first wall, the second wall, and the die-bonding region jointly define an accommodating space;
wherein a bottom side of the second wall is in a concave shape and is gaplessly connected to a top side of the first wall, and wherein in a cross section of the multi-layer surrounding dam perpendicular to the substrate, the bottom side and a top side of the second wall are each in an arc shape, and a radius of curvature of the top side of the second wall is less than a radius of curvature of the bottom side of the second wall.

13. The carrier according to claim 12, wherein an outer lateral side of the multi-layer surrounding dam has a maximum outer diameter, and an inner lateral side of the multi-layer surrounding dam has a minimum inner diameter that is at least 80% of the maximum outer diameter.

14. The carrier according to claim 12, wherein an outer lateral side and an inner lateral side of the multi-layer surrounding dam have a maximum width there-between that is less than or equal to a height of the multi-layer surrounding dam with respect to the first board surface.

15. The carrier according to claim 14, wherein the maximum width of the multi-layer surrounding dam is within in a range of 70% to 80% of the height of the multi-layer surrounding dam.

16. The carrier according to claim 12, wherein each of the first wall and the second wall is arranged head-tail so as to form a ring-shaped structure, and a head-tail junction of the second wall is not located at the same location as a head-tail junction of the first wall.

17. The carrier according to claim 12, wherein an inner lateral side of the multi-layer surrounding dam has a ring-shaped groove recessed in a connection portion between the first wall and the second wall.

18. The carrier according to claim 12, wherein the encapsulating colloid has a plurality of phosphor embedded therein, and wherein in the cross section of the multi-layer surrounding dam perpendicular to the substrate, the radius of the curvature of the top side of the second wall is less than or equal to 50% of a maximum width of the second wall.

19. The carrier according to claim 12, wherein the second wall does not contact the first board surface of the substrate, and the die-bonding region of the first board surface is a light reflective surface.

20. A light emitting diode (LED) package structure, comprising:
a carrier including:
a substrate having a first board surface and a second board surface that is opposite to the first board surface; and
a multi-layer surrounding dam formed on the first board surface of the substrate and including:
a first wall being in a ring-shape and disposed on the first board surface, wherein a portion of the first board surface surrounded by the first wall is defined as a die-bonding region; and
a second wall being in a ring-shape and stacked on the first wall, wherein the first wall, the second wall, and the die-bonding region jointly define an accommodating space;
a plurality of LED chips mounted on the die-bonding region of the substrate and arranged in the accommodating space; and an encapsulating colloid filled within the accommodating space, wherein the LED chips are embedded in the encapsulating colloid;

wherein a bottom side of the second wall is in a concave shape and is gaplessly connected to a top side of the first wall, and wherein in a cross section of the multi-layer surrounding dam perpendicular to the substrate, the bottom side and a top side of the second wall are each in an arc shape, and a radius of curvature of the top side of the second wall is less than a radius of curvature of the bottom side of the second wall.

* * * * *